United States Patent
Doan et al.

(10) Patent No.: US 6,893,506 B2
(45) Date of Patent: May 17, 2005

(54) ATOMIC LAYER DEPOSITION APPARATUS AND METHOD

(75) Inventors: Trung Tri Doan, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 10/097,025

(22) Filed: Mar. 11, 2002

(65) Prior Publication Data

US 2003/0170403 A1 Sep. 11, 2003

(51) Int. Cl.[7] .............................. C23C 16/00; C23F 1/00
(52) U.S. Cl. .................. 118/719; 118/715; 156/345.29; 156/345.31
(58) Field of Search ...................... 118/715; 156/345.29

(56) References Cited

U.S. PATENT DOCUMENTS

| | | | | |
|---|---|---|---|---|
| 4,058,430 A | * | 11/1977 | Suntola et al. | 427/255.13 |
| 4,793,283 A | * | 12/1988 | Sarkozy | 118/725 |
| 5,000,225 A | * | 3/1991 | Murdoch | 137/625.46 |
| 5,105,853 A | * | 4/1992 | Lie | 137/625.46 |
| 5,242,539 A | * | 9/1993 | Kumihashi et al. | 216/67 |
| 5,286,296 A | * | 2/1994 | Sato et al. | 118/719 |
| 5,391,260 A | * | 2/1995 | Makino et al. | 216/69 |
| 5,607,510 A | * | 3/1997 | Makino et al. | 118/723 MA |
| 5,611,863 A | * | 3/1997 | Miyagi | 118/723 MP |
| 5,746,581 A | * | 5/1998 | Okumura et al. | 417/2 |
| 6,037,272 A | * | 3/2000 | Park et al. | 438/758 |
| 6,206,970 B1 | * | 3/2001 | Atwell | 118/715 |
| 6,214,120 B1 | * | 4/2001 | Kim | 118/719 |
| 6,270,572 B1 | | 8/2001 | Kim et al. | 117/93 |
| 6,306,247 B1 | * | 10/2001 | Lin | 156/345.29 |
| 6,316,045 B1 | * | 11/2001 | Bernard et al. | 427/8 |
| 6,391,803 B1 | | 5/2002 | Kim et al. | |
| 6,410,408 B1 | * | 6/2002 | Yano | 438/484 |
| 6,461,436 B1 | * | 10/2002 | Campbell et al. | 118/715 |
| 6,503,379 B1 | * | 1/2003 | Kidd et al. | 204/298.05 |
| 6,511,539 B1 | | 1/2003 | Raaijmakers | 117/102 |
| 6,572,924 B1 | * | 6/2003 | Halpin | 427/255.28 |
| 6,630,201 B2 | | 10/2003 | Chiang et al. | |
| 6,635,965 B1 | | 10/2003 | Lee et al. | 257/758 |
| 6,730,367 B2 | | 5/2004 | Sandhu | |
| 2003/0153177 A1 | | 8/2003 | Tepman et al. | |

FOREIGN PATENT DOCUMENTS

| | | | | | |
|---|---|---|---|---|---|
| JP | 62192582 A | * | 8/1987 | | C23C/16/44 |
| JP | 01021080 A | * | 1/1989 | | C23C/16/50 |
| JP | 01187380 A | * | 7/1989 | | F04B/41/06 |
| JP | 01189114 A | * | 7/1989 | | H01L/21/205 |
| JP | 02220367 A | * | 9/1990 | | H01M/10/40 |
| JP | 06005520 A | * | 1/1994 | | H01L/21/205 |
| JP | 11222678 A | * | 8/1999 | | C23C/16/44 |
| JP | 2001220677 A | * | 8/2001 | | C23C/16/455 |

* cited by examiner

Primary Examiner—Parviz Hassanzadeh
Assistant Examiner—Karla Moore
(74) Attorney, Agent, or Firm—Wells St. John P.S.

(57) ABSTRACT

An atomic layer deposition method includes positioning a semiconductor substrate within an atomic layer deposition chamber. A first deposition precursor is fed to the chamber under first vacuum conditions effective to form a first monolayer on the substrate. The first vacuum conditions are maintained at least in part by a first non-roughing vacuum pump connected to the chamber and through which at least some of the first deposition precursor flows. After forming the first monolayer, a purge gas is fed to the chamber under second vacuum conditions maintained at least in part by a second non-roughing vacuum pump connected to the chamber which is different from the first non-roughing vacuum pump and through which at least some of the purge gas flows. An atomic layer deposition apparatus is disclosed.

27 Claims, 4 Drawing Sheets

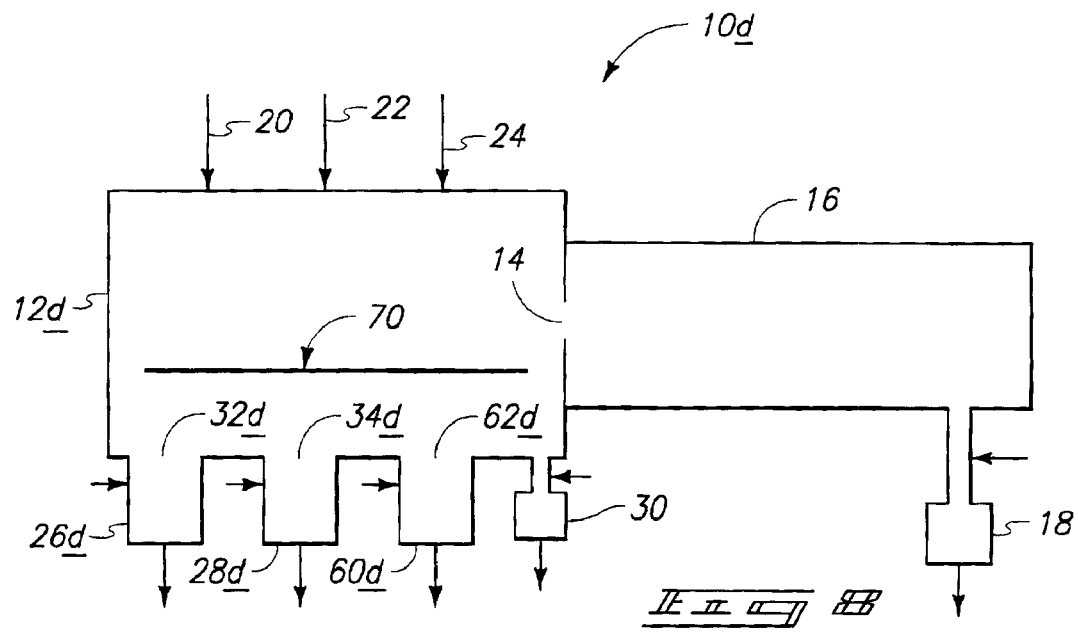
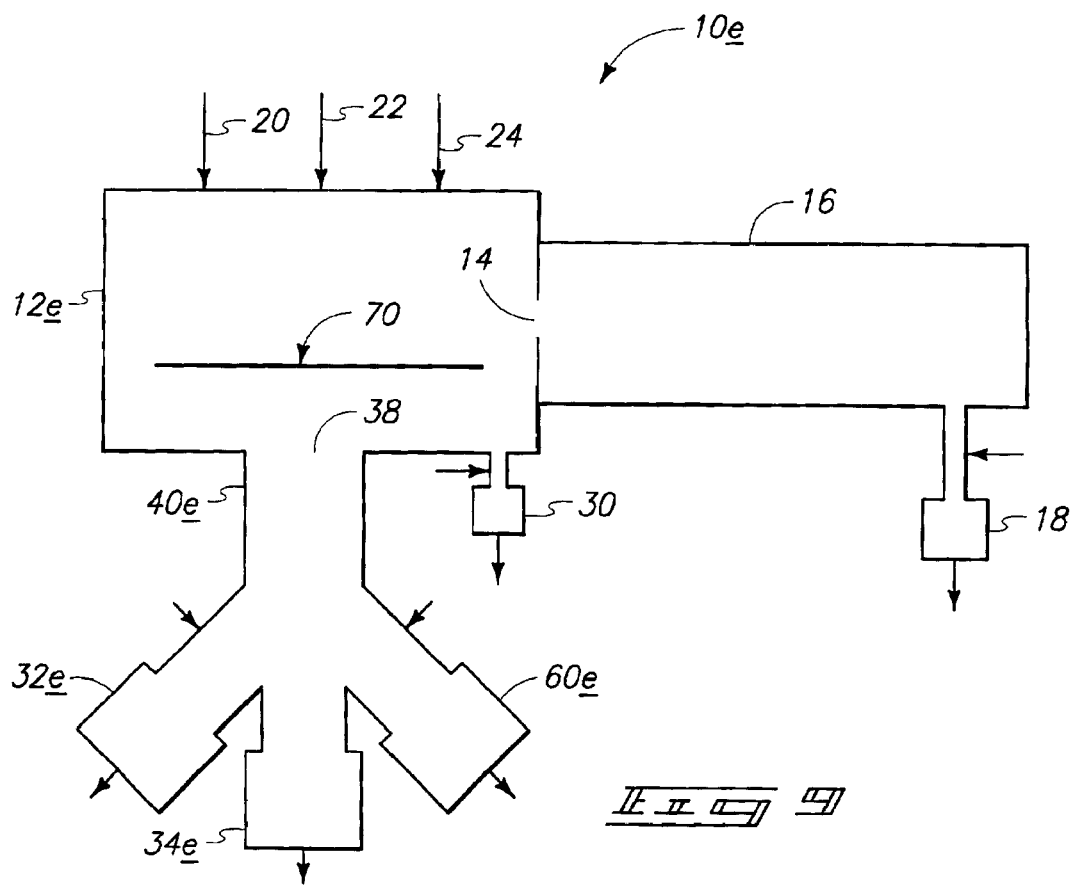

ATOMIC LAYER DEPOSITION APPARATUS AND METHOD

TECHNICAL FIELD

This invention relates to atomic layer deposition.

BACKGROUND OF THE INVENTION

Atomic layer deposition involves the deposition of successive monolayers over a substrate within a deposition chamber typically maintained at subatmospheric pressure. An exemplary such method includes feeding a single vaporized precursor to a deposition chamber effective to form a first monolayer over a substrate received therein. Thereafter, the flow of the first deposition precursor is ceased and an inert purge gas is flowed through the chamber effective to remove any remaining first precursor which is not adhering to the substrate from the chamber. Subsequently, a second vapor precursor different from the first is flowed to the chamber effective to form a second monolayer on/with the first monolayer. The second monolayer might react with the first monolayer. Additional precursors can form successive monolayers, or the above process can be repeated until a desired thickness and composition layer has been formed over the substrate.

The invention includes improvements in apparatus and methods of atomic layer depositions, whether existing or yet-to-be developed, whereby at least one monolayer is formed over a substrate.

SUMMARY

The invention includes atomic layer deposition methods and apparatus. In one implementation, an atomic layer deposition method includes positioning a semiconductor substrate within an atomic layer deposition chamber. A first deposition precursor is fed to the chamber under first vacuum conditions effective to form a first monolayer on the substrate. The first vacuum conditions are maintained at least in part by a first non-roughing vacuum pump connected to the chamber and through which at least some of the first deposition precursor flows. After forming the first monolayer, a purge gas is fed to the chamber under second vacuum conditions maintained at least in part by a second non-roughing vacuum pump connected to the chamber which is different from the first non-roughing vacuum pump and through which at least some of the purge gas flows.

In one implementation, an atomic layer deposition apparatus includes an atomic layer deposition chamber having a substrate passageway communicating to externally of the chamber. A first non-roughing vacuum pump is in fluid communication with the chamber apart from the substrate passageway. A second non-roughing vacuum pump is in fluid communication with the chamber apart from the substrate passageway.

BRIEF DESCRIPTION OF THE DRAWINGS

Preferred embodiments of the invention are described below with reference to the following accompanying drawings.

FIG. 8 is a diagrammatic depiction of an atomic layer deposition apparatus in accordance with an aspect of the invention.

FIG. 9 is a diagrammatic depiction of an atomic layer deposition apparatus in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
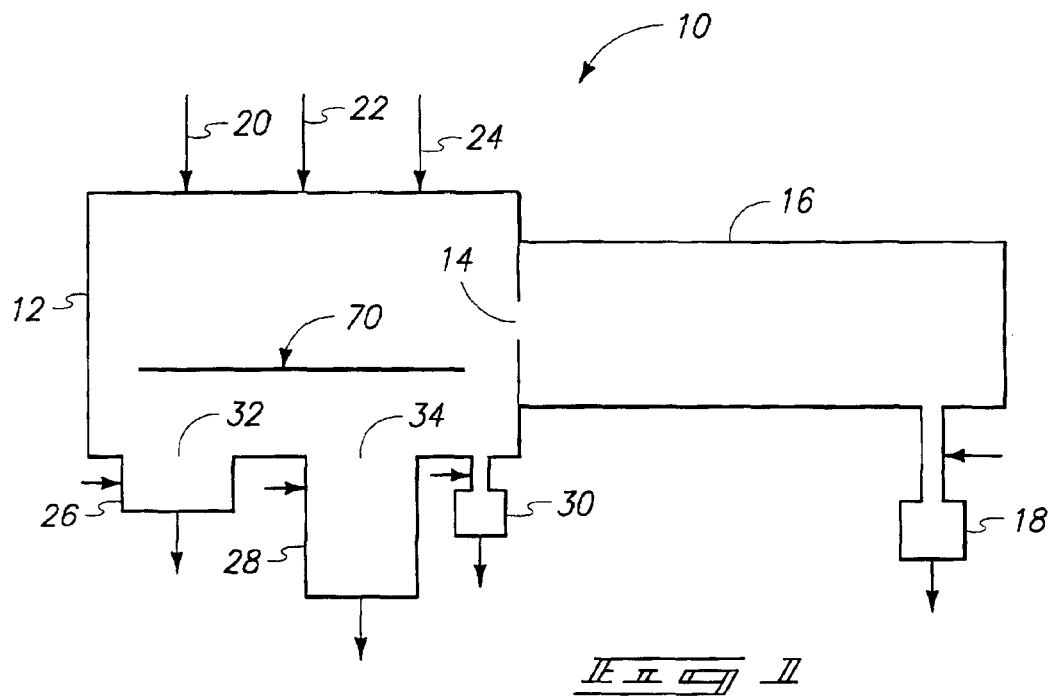
FIG. 1 is a diagrammatic depiction of an atomic layer deposition apparatus in accordance with an aspect of the invention.

FIG. 1 depicts a first embodiment atomic layer deposition apparatus 10. Such comprises an atomic layer deposition chamber 12 having a substrate passageway 14 communicating to externally of the chamber. A load chamber 16 is in fluid communication with atomic layer deposition chamber 12 through substrate passageway 14. A load chamber vacuum pump is diagrammatically depicted with numeral 18, and is in fluid communication with load chamber 16 apart from through substrate passageway 14. Load chamber vacuum pump 18 includes an illustrated discharge indicated by a downward arrow, and a by-pass inlet illustrated by a horizontal arrow pointing to the left proximate thereto. In the preferred embodiment, additional vacuum pumps might be associated with load chamber 16 and/or pump 18 could be configured to include a roughing vacuum pump apparatus and a non-roughing vacuum pump apparatus. In the context of this document, a "roughing vacuum pump" is a vacuum pump (or sub-pumping components/apparatus of a non-roughing vacuum pump) which is configured to provide an initial reduced pressure from at or near atmospheric pressure, and which is used with a non-roughing vacuum pump that further reduces pressure. Also in the context of this document, a "non-roughing vacuum pump" is a vacuum pump configured to provide a subatmospheric deposition operating pressure within the chamber.

In the illustrated exemplary embodiment, atomic layer deposition chamber 12 is provided with three gas inlets 20, 22 and 24. By way of example only, any two of such inlets might be configured for feeding different deposition precursors to chamber 12, with the remaining inlet being configured for feeding a purge gas to deposition chamber 12.

A first non-roughing vacuum pump 26 is in fluid communication with deposition chamber 12 apart from substrate passageway 14. A second non-roughing vacuum pump 28 is in fluid communication with deposition chamber 12 apart from substrate passageway 14. Any suitable pumps capable of producing a desired subatmospheric deposition pressure are contemplated whether existing or yet-to-be developed. By way of example only, such include turbomolecular pumps, diffusion pumps, sublimation pumps, cryo pumps, diffusion ejector pumps, absorption pumps, sliding-vane rotary pumps, rotary piston pumps, rotary plunger pumps, root pumps, etc. A roughing vacuum pump 30 is provided in fluid communication with chamber 12 apart from substrate passageway 14. As described above with respect to load chamber vacuum pump 18, a roughing vacuum pump may or may not be utilized, and might alternately comprise a sub-pumping device of non-roughing vacuum pump assemblies. Further, such might be in fluid communication with chamber 12 through a separate line from non-roughing vacuum pumps 26 and 28 (as shown), or through conduits or other gas passageways (not shown) associated with non-roughing vacuum pumps 26 and 28. Further of course, non-roughing vacuum pumps 26 and 28 could comprise respective multiple pumping devices/components/apparatus (roughing and/or non-roughing) connected in series and/or in parallel.

The first and second non-roughing vacuum pumps can be configured to have different rated throughputs over a given operating pressure range. Alternately, the first and second non-roughing vacuum pumps can be configured to have common rated throughputs over a given operating pressure range. Second non-roughing vacuum pump 28 is depicted as being diagrammatically larger than first non-roughing vacuum pump 26, thereby having corresponding larger and smaller throughputs, respectively. In such depicted preferred embodiment, second non-roughing vacuum pump 28 is configured with chamber 12 for feeding a purge gas to the chamber, while first non-roughing vacuum pump 26 is configured with chamber 12 for feeding a deposition precursor to the chamber. For example, and by way of example only, it might be desirable to draw or feed the purge gas through the system at much higher throughput over a given pressure range than a throughput which would be desired over a given pressure range (under the same or different pressure range) for a deposition precursor. Also, first and second non-roughing vacuum pumps 26 and 28 might be configured for operating at variable speeds over a given operating pressure range, or configured for operating at respective constant speeds over a given operating pressure range. Further, one may be configured for operating at a constant speed over a given operating pressure range with the other being configured for operating at variable speeds over a given operating pressure range.

FIG. 1 depicts an embodiment whereby chamber 12 is provided with multiple outlets 32 and 34, with one of said outlets (outlet 32) being in fluid communication with first non-roughing vacuum pump 26 and another of said outlets (outlet 34) being in fluid communication with second non-roughing vacuum pump 28. Of course, pressure control valving or other apparatus could be associated with one or more of the illustrated pumps, outlets and/or conduits for controlling the pressure, or isolating one or more pumps from the chamber while one or more other pump(s) operate (s) relative to the chamber. For example, by-pass inlets are illustrated by respective horizontal arrows pointing to the right proximate each pump, for example should a pump be isolated from communicating with chamber 12 during operation. Such might be used to minimize transient pressure changes with respect to the feedlines when switching between pumps.

Figure 2:
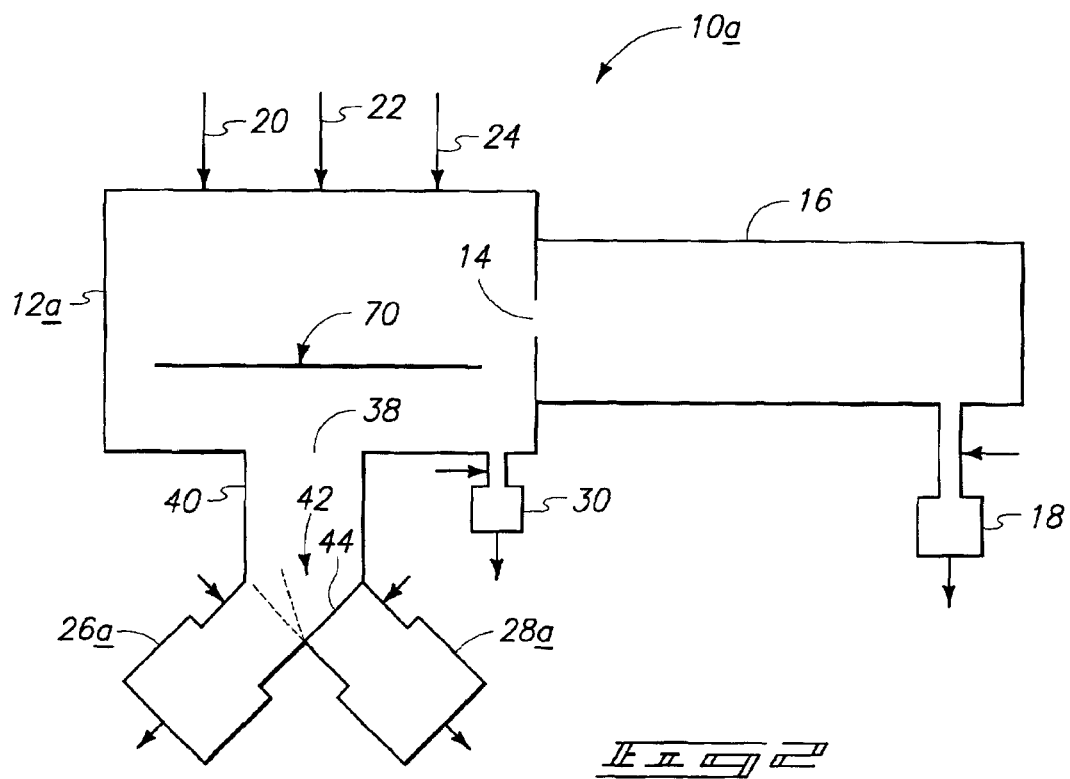
FIG. 2 is a diagrammatic depiction of an atomic layer deposition apparatus in accordance with an aspect of the invention.

FIG. 2 illustrates an alternate embodiment 10a. Like numerals from the first embodiment are utilized where appropriate, with differences being indicated by the suffix "a" or with different numerals. Atomic layer deposition apparatus 10a is provided with one outlet 38 at chamber 12 which is in fluid communication with both first and second non-roughing vacuum pumps 26a and 28a, respectively. In this exemplary depicted preferred embodiment, a suitable conduit 40 extends from outlet 38. First and second non-roughing vacuum pumps 26a and 28a, respectively, are in fluid communication with conduit 40. At least one isolation valve is associated with the illustrated first and second pumps. In the depicted preferred embodiment, there is one and only one such isolation valve diagrammatically depicted as an embodiment 42. Further in the depicted embodiment, isolation valve assembly 42 is in the form of a pivotable flap valve 44 received within conduit 40 and configured for selectively isolating the first and second pumps 26a and 28a, respectively, from fluid communication with conduit 40.

Figure 3:
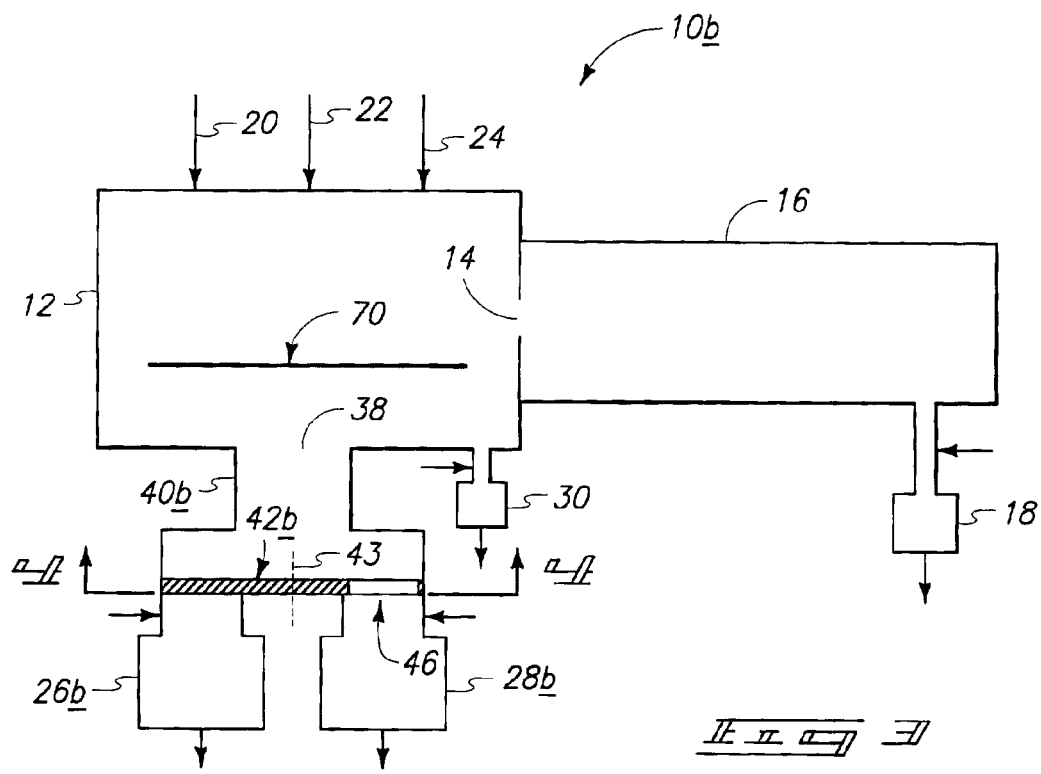
FIG. 3 is a diagrammatic depiction of an atomic layer deposition apparatus in accordance with an aspect of the invention.
Figure 4:
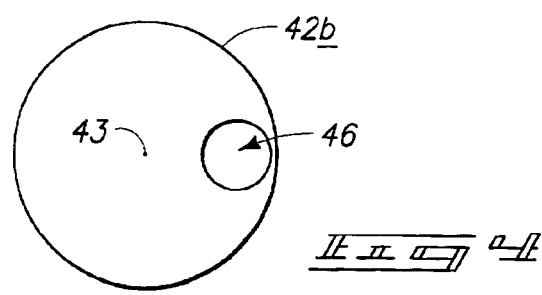
FIG. 4 is a sectional view taken through line 4—4 in FIG. 3.
Figure 5:
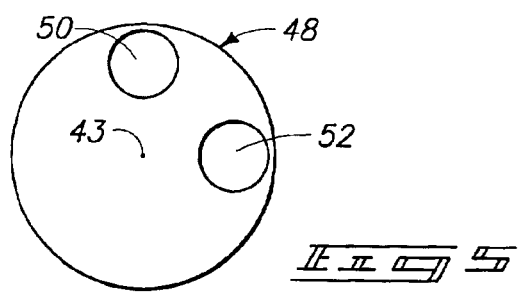
FIG. 5 is an alternate embodiment sectional view as would be taken through line 4—4 in FIG. 3.

FIGS. 3–5 depict an alternate embodiment atomic layer deposition apparatus 10b. Like numerals from the first and second described embodiments are utilized where appropriate, with differences being indicated by the suffix "b" or with different numerals. Atomic layer deposition apparatus 10b includes a rotatable valve 42b received within conduit 40b, and which is configured for selectively isolating first and second pumps 26b and 28b, respectively, from fluid communication with conduit 40b. Rotatable valve 42b is depicted in the exemplary embodiment as being mounted for rotation about a central axis 43. A valve opening 46 is received radially from axis 43 and can be selectively positioned to provide flow relative to second non-roughing vacuum pump 28b (as shown), or with respect to first non-roughing vacuum pump 26b by 180° rotation about axis 43 (not shown).

FIG. 5 depicts an exemplary alternate embodiment rotatable valve 48 having two adjacent valve openings 50 and 52 positioned proximate to but radially 90° from one another. This particular exemplary embodiment would enable switching between first non-roughing vacuum pump 26b and second non-roughing vacuum pump 28b by 90° rotation as opposed to the 180° of rotation with respect to the 42b diagrammatic embodiment.

Figure 6:
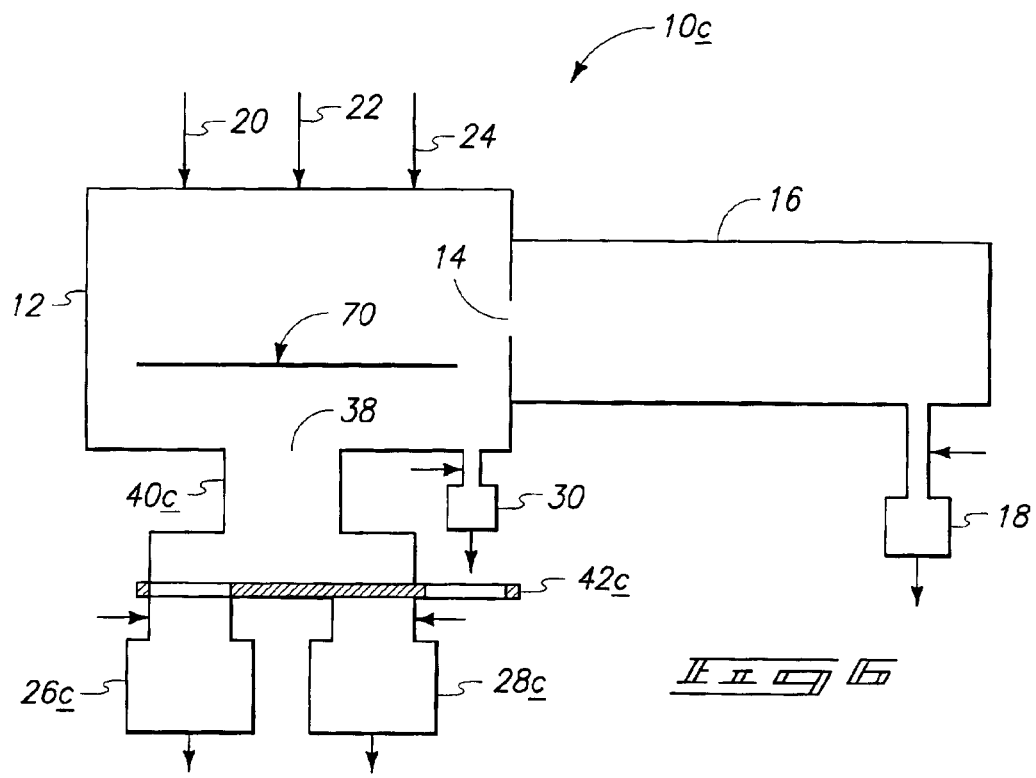
FIG. 6 is a diagrammatic depiction of an atomic layer deposition apparatus in accordance with an aspect of the invention in a first operational state.
Figure 7:
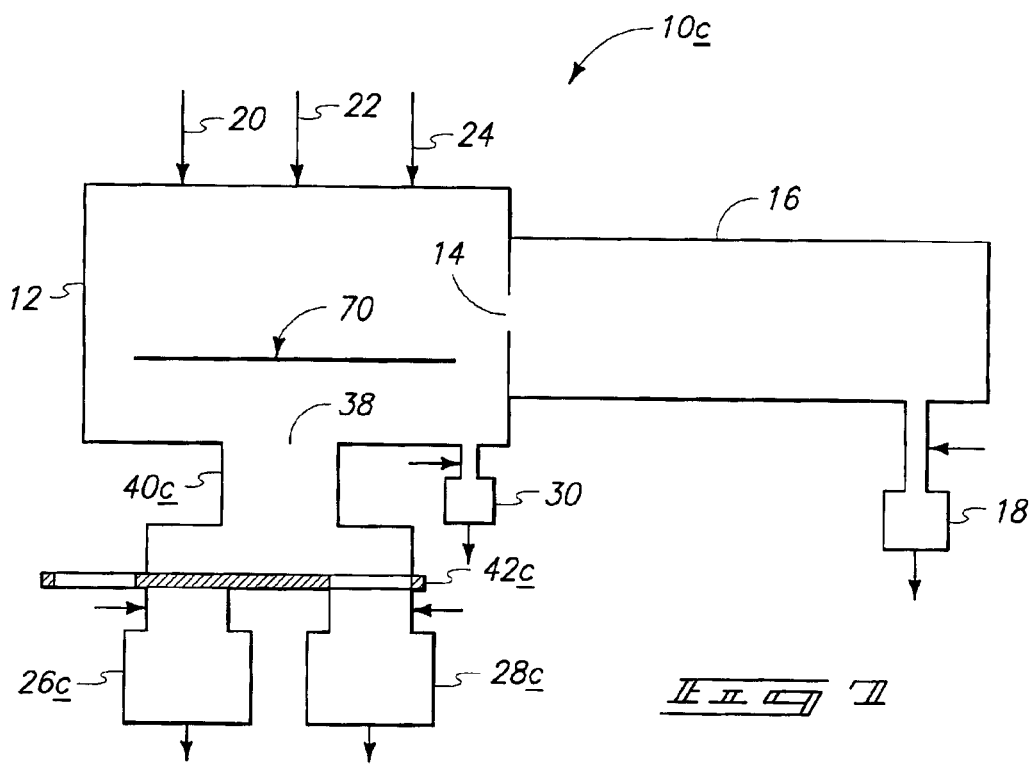
FIG. 7 is a view of the FIG. 6 apparatus in a second operational state.

FIGS. 6 and 7 illustrate another alternate embodiment atomic layer deposition apparatus 10c, and in different respective operational configurations. Like numerals from the above-described embodiments are utilized where appropriate, with differences being indicated with the suffix "c", or with different numerals. Valve assembly 42c is depicted diagrammatically as a slidable valve received within conduit 40c and configured for selectively isolating first and second pumps 26c and 28c, respectively, from fluid communication with conduit 40c. FIG. 6 depicts one operational configuration where valve 42c is slid to provide fluid communication of pump 26c with conduit 40c, while second pump 28c is restricted from fluid communication with conduit 40c. FIG. 7 depicts the opposite.

Of course, any additional or alternate isolating valving assemblies, whether existing or yet-to-be developed, might be utilized.

FIG. 8 illustrates another alternate embodiment atomic layer deposition apparatus 10d. Like numerals from the above-described embodiments are utilized where appropriate, with differences being indicated with the suffix "d", or with different numerals. Atomic layer deposition apparatus 10d comprises a third non-roughing vacuum pump 60d in fluid communication with chamber 12d apart from substrate passageway 14. In one preferred embodiment, third non-roughing vacuum pump 60d is configured with chamber 12d for feeding a second deposition precursor to chamber 12d. For example, in one preferred embodiment, separate precursor feed pumps (i.e., pumps 26d and 60d) are separately optimized for their respective different deposition precursors (for example, in one or both of materials of construction or designed throughput) while another of the non-roughing vacuum pumps (i.e., pump 28d) is configured for feeding a purge gas to the chamber (for example, with respect to desired higher throughput than with the deposition precursors).

The FIG. 8 depicted embodiment shows chamber 12d as being provided with multiple outlets 32d, 34d and 62d, which are in respective fluid communication with first non-roughing vacuum pump 26d, second non-roughing vacuum pump 28d and third non-roughing vacuum pump 60d, respectively. FIG. 9 depicts an alternate embodiment atomic layer deposition apparatus 10e wherein a chamber 12e is provided with one outlet 40e at the chamber. Outlet 40e is in fluid communication with each of first, second and third non-roughing vacuum pumps 32e, 34e and 60e, respectively. Of course, more than three non-roughing vacuum pumps could be utilized.

The invention contemplates an atomic layer deposition method using the above-described apparatus, and methods independent thereof. In other words, the concluding apparatus claims are not limited by the method claims, nor are the concluding method claims limited by any attribute of the apparatus claims, unless literal language appears in such claims and without any limiting or interpretative reference to the specification or drawings. The respective method claim families and apparatus claim families stand as literally worded without reference to the other. An exemplary first embodiment atomic layer deposition method in accordance with the invention positions a semiconductor substrate within an atomic layer deposition chamber, for example any of the above-described chambers. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Such positioning can occur by passing a substrate 70 to be processed from load chamber 16 through substrate passageway 14 onto a suitable substrate holder (not shown) within atomic layer deposition chamber 12. A first deposition precursor is fed through the chamber under first vacuum conditions effective to form a first monolayer on the substrate. The first vacuum conditions are maintained, at least in part, by a first non-roughing vacuum pump connected to the chamber and through which at least some of the first deposition precursor flows.

After forming the first monolayer, a purge gas is fed to the chamber under second vacuum conditions maintained, at least in part, by a second non-roughing vacuum pump connected to the chamber, which is different from the first non-roughing vacuum pump, and through which at least some of the purge gas flows. In one preferred embodiment, a roughing vacuum pump is utilized to lower chamber pressure prior to feeding the first deposition precursor. In one preferred embodiment, after feeding the purge gas, a second deposition precursor, different from the first deposition precursor, is fed to the chamber effective to form a second monolayer on the first monolayer. In the context of atomic layer deposition, any existing or yet-to-be developed deposition precursors are of course contemplated. The second deposition precursor feeding might be conducted under third vacuum conditions effective to form a second monolayer on the first monolayer using the first non-roughing vacuum pump. Alternately by way of example only, the second deposition precursor feeding to the chamber might be conducted under third vacuum conditions maintained, at least in part, by a third non-roughing vacuum pump connected to the chamber, which is different from the first and second non-roughing vacuum pumps.

In one preferred embodiment, the first vacuum conditions include a substantially constant vacuum pressure within the chamber. In another preferred embodiment, the first vacuum conditions include varied vacuum pressure within the chamber. In yet another preferred embodiment, the vacuum pressure within the chamber is substantially the same under the first and second vacuum conditions, and in a most preferred embodiment, the vacuum pressure is substantially constant within the chamber under the first and second vacuum conditions. In another preferred embodiment, the vacuum pressure within the chamber is different under the first and second vacuum conditions, and in a sub-embodiment, preferably is both substantially constant during each of the first and second vacuum conditions but different from one another under the first and second vacuum conditions.

In one preferred embodiment, an atomic layer deposition method in accordance with the invention includes isolating the first non-roughing vacuum pump from the chamber during at least some of the purge gas feeding. In another preferred embodiment, the method includes isolating the second non-roughing vacuum pump from the chamber during at least some of the first deposition precursor feeding, and in one sub-embodiment, preferably during all of the first deposition precursor feeding.

In one preferred embodiment, the method comprises operating the second non-roughing vacuum pump at a higher pumping speed during the purge gas feeding than the first non-roughing vacuum pump is operated at during the first deposition precursor feeding.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An atomic layer deposition apparatus, comprising:
   an atomic layer deposition chamber sized to retain no more than a single wafer at a time for atomic layer depositing upon, the atomic layer deposition chamber having a substrate passageway communicating to externally of the chamber;
   a first non-roughing vacuum pump in fluid communication with the chamber apart from the substrate passageway;
   a second non-roughing vacuum pump in fluid communication with the chamber apart from the substrate passageway; and
   a roughing vacuum pump in fluid communication with the chamber apart from the substrate passageway and through a conduit separate from which the first and second non-roughing vacuum pumps are in fluid communication with the chamber.

2. The apparatus of claim 1 comprising a third non-roughing vacuum pump in fluid communication with the chamber apart from the substrate passageway.

3. The apparatus of claim 1 comprising a load chamber in fluid communication with the atomic layer deposition chamber through the substrate passageway, and a load chamber vacuum pump in fluid communication with the load chamber apart from the substrate passageway.

4. The apparatus of claim 1 wherein the first non-roughing vacuum pump is configured for feeding a deposition precursor to the chamber and the second non-roughing vacuum pump is configured for feeding a purge gas to the chamber.

5. An atomic layer deposition apparatus, comprising:
an atomic layer deposition chamber sized to retain no more than a single wafer at a time for atomic layer depositing upon, the atomic layer deposition chamber having a substrate passageway communicating to externally of the chamber;
a first non-roughing vacuum pump in fluid communication with the chamber apart from the substrate passageway;
a second non-roughing vacuum pump in fluid communication with the chamber apart from the substrate passageway; and
wherein the first and second non-roughing vacuum pumps have different rated maximum throughput capacities over a given operating pressure range.

6. An atomic layer deposition apparatus, comprising:
an atomic layer deposition chamber sized to retain no more than a single wafer at a time for atomic layer depositing upon, the atomic layer deposition chamber having a substrate passageway communicating to externally of the chamber;
a first non-roughing vacuum pump in fluid communication with the chamber apart from the substrate passageway;
a second non-roughing vacuum pump in fluid communication with the chamber apart from the substrate passageway; and
wherein the first and second non-roughing vacuum pumps have different rated maximum throughput capacities over a given operating pressure range, the first non-roughing vacuum pump being configured for feeding a deposition precursor to the chamber and the second non-roughing vacuum pump being configured for feeding a purge gas to the chamber, the second non-roughing vacuum pump having a higher rated maximum throughput capacity than the first non-roughing vacuum pump over the given operating pressure range.

7. The apparatus of claim 1 wherein the first and second non-roughing vacuum pumps have common rated maximum throughput capacities over a given operating pressure range.

8. The apparatus of claim 1 wherein the first and second non-roughing vacuum pumps are configured for operating at variable speeds over a given operating pressure range.

9. The apparatus of claim 1 wherein the first and second non-roughing vacuum pumps are configured for operating at respective constant speeds over a given operating pressure range.

10. The apparatus of claim 1 wherein one of the first and second non-roughing vacuum pumps is configured for operating at a constant speed over a given operating pressure range, and the other of the first and second non-roughing vacuum pumps is configured for operating at variable speeds over a given operating pressure range.

11. The apparatus of claim 1 wherein the chamber is provided with multiple outlets at the chamber, one of said outlets being in fluid communication with the first non-roughing vacuum pump, another of said outlets being in fluid communication with the second non-roughing vacuum pump.

12. The apparatus of claim 1 wherein the chamber is provided with one outlet at the chamber which is in downstream fluid communication with both the first and second non-roughing vacuum pumps.

13. The apparatus of claim 12 comprising:
a conduit extending from the one outlet, the first and second non-roughing vacuum pumps being in fluid communication with the conduit; and
at least one first pump and second pump isolation valve.

14. The apparatus of claim 12 comprising:
a conduit extending from the one outlet, the first and second non-roughing vacuum pumps being in fluid communication with the conduit; and
one and only one first pump and second pump isolation valve.

15. The apparatus of claim 12 comprising:
a conduit extending from the one outlet, the first and second non-roughing vacuum pumps being in fluid communication with the conduit; and
a pivotable flap valve received within the conduit configured for selectively isolating the first and second pumps from fluid communication with the conduit.

16. An atomic layer deposition apparatus, comprising:
an atomic layer deposition chamber sized to retain no more than a single wafer at a time for atomic layer depositing upon, the atomic layer deposition chamber having a substrate passageway communicating to externally of the chamber;
a first non-roughing vacuum pump in fluid communication with the chamber apart from the substrate passageway;
a second non-roughing vacuum pump in fluid communication with the chamber apart from the substrate passageway;
the chamber being provided with one outlet at the chamber which is in downstream fluid communication with both the first and second non-roughing vacuum pumps;
a conduit extending from the one outlet, the first and second non-roughing vacuum pumps being in fluid communication with the conduit; and
a rotatable valve plate received within the conduit configured for selectively isolating the first and second pumps from fluid communication with the conduit, the rotatable valve plate being rotatable about an axis of rotation which is parallel with a line of gas flow path through the rotatable valve plate.

17. An atomic layer deposition apparatus, comprising:
an atomic layer deposition chamber sized to retain no more than a single wafer at a time for atomic layer depositing upon, the atomic layer deposition chamber having a substrate passageway communicating to externally of the chamber;
a first non-roughing vacuum pump in fluid communication with the chamber apart from the substrate passageway;
a second non-roughing vacuum pump in fluid communication with the chamber apart from the substrate passageway;
the chamber being provided with one outlet at the chamber which is in downstream fluid communication with both the first and second non-roughing vacuum pumps;

a conduit extending from the one outlet, the first and second non-roughing vacuum pumps being in fluid communication with the conduit; and a slidable valve plate received within the conduit configured for selectively isolating the first and second pumps from fluid communication with the conduit by non-rotating sliding action along a line that is perpendicular with a line of gas flow path through the slidable valve plate.

18. An atomic layer deposition apparatus, comprising:

an atomic layer deposition chamber sized to retain no more than a single wafer at a time for atomic layer depositing upon, the atomic layer deposition chamber having a substrate passageway communicating to externally of the chamber;

a first non-roughing vacuum pump in fluid communication with the chamber apart from the substrate passageway, the first non-roughing vacuum pump being configured with the chamber for feeding a first deposition precursor to the chamber;

a second non-roughing vacuum pump in fluid communication with the chamber apart from the substrate passageway, the second non-roughing vacuum pump being configured with the chamber for feeding a purge gas to the chamber;

a third non-roughing vacuum pump in fluid communication with the chamber apart from the substrate passageway, the third non-roughing vacuum pump being configured with the chamber for feeding a second deposition precursor to the chamber; and a roughing vacuum pump in fluid communication with the chamber apart from the substrate passageway and through a conduit separate from which the first and second non-roughing vacuum pumps are in fluid communication with the chamber.

19. The apparatus of claim 18 comprising a load chamber in fluid communication with the atomic layer deposition chamber through the substrate passageway, and a load chamber vacuum pump in fluid communication with the load chamber apart from the substrate passageway.

20. The apparatus of claim 18 wherein the first and third non-roughing vacuum pumps have different rated maximum throughput capacities over a given operating pressure range as compared to the second non-roughing vacuum pump.

21. The apparatus of claim 20 wherein the second non-roughing vacuum pump has a higher rated maximum throughput capacity than either of the first and second non-roughing vacuum pumps.

22. An atomic layer deposition apparatus, comprising:

an atomic layer deposition chamber sized to retain no more than a single wafer at a time for atomic layer depositing upon, the atomic layer deposition chamber having a substrate passageway communicating to externally of the chamber;

a first non-roughing vacuum pump in fluid communication with the chamber apart from the substrate passageway, the first non-roughing vacuum pump being configured with the chamber for feeding a first deposition precursor to the chamber;

a second non-roughing vacuum pump in fluid communication with the chamber apart from the substrate passageway, the second non-roughing vacuum pump being configured with the chamber for feeding a purge gas to the chamber;

a third non-roughing vacuum pump in fluid communication with the chamber apart from the substrate passageway, the third non-roughing vacuum pump being configured with the chamber for feeding a second deposition precursor to the chamber; and wherein the first and third non-roughing vacuum pumps have a common rated maximum throughput capacity over a given operating pressure range and which is different as compared to the second non-roughing vacuum pump.

23. The apparatus of claim 22 wherein the second non-roughing vacuum pump has a higher rated maximum throughput capacity than that of the first and second non-roughing vacuum pumps.

24. The apparatus of claim 18 wherein the chamber is provided with multiple outlets at the chamber, one of said outlets being in fluid communication with the first non-roughing vacuum pump, another of said outlets being in fluid communication with the second non-roughing vacuum pump, still another of said outlets being in fluid communication with the third non-roughing vacuum pump.

25. The apparatus of claim 18 wherein the chamber is provided with one outlet at the chamber which is in downstream fluid communication with each of the first, second and third non-roughing vacuum pumps.

26. An atomic layer deposition apparatus, comprising:

an atomic layer deposition chamber sized to retain no more than a single wafer at a time for atomic layer depositing upon, the atomic layer deposition chamber having a substrate passageway communicating to externally of the chamber;

a first non-roughing vacuum pump in fluid communication with the chamber apart from the substrate passageway;

a second non-roughing vacuum pump in fluid communication with the chamber apart from the substrate passageway;

the chamber being provided with one outlet at the chamber which is in downstream fluid communication with both the first and second non-roughing vacuum pumps;

a conduit extending from the one outlet, the first and second non-roughing vacuum pumps being in fluid communication with the conduit; and a rotatable valve plate received within the conduit configured for selectively isolating the first and second pumps from fluid communication with the conduit, the rotatable valve plate being rotatable about an axis of rotation which is parallel with a line of gas flow path through the rotatable valve plate, the rotatable valve plate being configured for rotation about a minimum of 180° in switching between isolating the first and second pumps from one another relative to the conduit.

27. An atomic layer deposition apparatus, comprising:

an atomic layer deposition chamber sized to retain no more than a single wafer at a time for atomic layer depositing upon, the atomic layer deposition chamber having a substrate passageway communicating to externally of the chamber;

a first non-roughing vacuum pump in fluid communication with the chamber apart from the substrate passageway;

a second non-roughing vacuum pump in fluid communication with the chamber apart from the substrate passageway;

the chamber being provided with one outlet at the chamber which is in downstream fluid communication with both the first and second non-roughing vacuum pumps;

a conduit extending from the one outlet, the first and second non-roughing vacuum pumps being in fluid communication with the conduit; and a rotatable valve plate received within the conduit configured for selectively isolating the first and second pumps from fluid communication with the conduit, the rotatable valve plate being rotatable about an axis of rotation which is parallel with a line of gas flow path through the rotatable valve plate, the rotatable valve plate being configured for rotation about a minimum of 90° in switching between isolating the first and second pumps from one another relative to the conduit.

* * * * *